United States Patent [19]
Stein

[11] 4,166,288
[45] Aug. 28, 1979

[54] INTEGRATED CURRENT SUPPLY

[75] Inventor: Karl-Ulrich Stein, Munich, Fed. Rep. of Germany

[73] Assignee: Siemens Aktiengesellschaft, Berlin & Munich, Fed. Rep. of Germany

[21] Appl. No.: 825,146

[22] Filed: Aug. 16, 1977

[30] Foreign Application Priority Data

Aug. 24, 1976 [DE] Fed. Rep. of Germany ....... 2638086

[51] Int. Cl.² .............................................. H02M 7/00
[52] U.S. Cl. .................................................... 363/147
[58] Field of Search ............. 307/237, 297; 323/22 R; 363/147

[56] References Cited

U.S. PATENT DOCUMENTS

| | | | |
|---|---|---|---|
| 3,509,446 | 4/1970 | Mullaly | 363/147 |
| 3,909,700 | 9/1975 | Ferro | 363/147 |
| 4,040,082 | 8/1977 | Goser | 307/279 X |
| 4,053,798 | 10/1977 | Koike et al. | 307/279 X |

OTHER PUBLICATIONS

*Electronics Letters*, "Multistable Circuit Using Complementary Field-Effect Transistors", Dec. 11, 1975, vol. 11, Nos. 25/26, pp. 613–614.
*IEEE Journal of Solid-State Circuits*, "Complementary JFET Negative-Resistance Devices", vol. SC-10, No. 6, 1975, pp. 509–510.

*Primary Examiner*—William M. Shoop
*Attorney, Agent, or Firm*—Hill, Van Santen, Steadman, Chiara & Simpson

[57] ABSTRACT

A current supply circuit is disclosed for supplying current to an integrated circuit. The current supply circuit has a circuit element for rectifying an input current which blocks when a negative voltage is connected thereacross, which passes current in a predetermined positive voltage pass band, and which blocks current again for positive voltages higher than the pass band. A filter capacitor is connected to an output of the circuit element. The current supply circuit is preferably integrated on the same chip as the circuit to which it is supplying current with the filter capacitor being connected in outboard fashion.

10 Claims, 6 Drawing Figures

INTEGRATED CURRENT SUPPLY

BACKGROUND OF THE INVENTION

The invention relates to an integrated current supply having a rectifier and filter capacitor for supplying operating current to a circuit which is preferably integrated.

Conventional current supplies which are equipped virtually entirely with discrete components generally consist of transformers, rectifiers and smoothing circuits.

SUMMARY OF THE INVENTION

An object of the present invention consists in providing a low cost integrated current supply which is suitable for a series of mass uses for individual integrated circuits.

According to the invention, an integrated current supply is provided for supplying current to an integrated circuit wherein the current supply has a Lambda circuit element which rectifies an input current since it blocks when negative voltages are connected thereacross, passes current in a predetermined positive voltage pass band, and which blocks current again for positive voltages higher than the pass band. A capacitor is connected at an output of the Lambda circuit element and this output is also connected to the circuit to which current is to be supplied. Preferably both the circuit to be supplied current and the current supply are integrated on a common chip.

A fundamental advantage consists in that the current supplies in accordance with the invention act as automatically controlled rectifiers for higher voltages.

DESCRIPTION OF THE PREFERRED EMBODIMENTS

The Lambda elements for current supplies corresponding to the invention in accordance with FIGS. 1 to 4 are dipoles which have a blocking action when negative voltages are connected, which possess a pass band when positive voltages are connected, and which have a blocking action again in the case of still higher positive voltages. FIG. 5 illustrates the characteristic curve of these current supplies. In current supplies corresponding to the invention, these Lambda elements serve as rectifiers and as series resistances. They can be employed as rectifiers in known current supply circuits, such as, for example, single path and bridge circuits.

Figure 1:
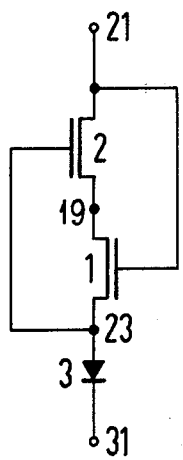
FIGS. 1 to 4 are circuit diagrams of Lambda elements for integrated current supplies corresponding to the invention.

The current supply illustrated in FIG. 1 consists of the two field effect transistors 1 and 2 and a diode 3. Preferably the field effect transistors 1 and 2 are MOS field effect transistors which are complementary to one another. The field effect transistor 1 is, for example, a p-channel, MOS field effect transistor, and the field effect transistor 2 is a n-channel MOS field effect transistor of the normally-on conductivity type. The voltage is connected to the terminals 21 and 31. The terminal 21 is connected to the drain or source terminal of the n-channel transistor 2. At the point 19 the drain or source terminal of the field effect transistor 2 is connected to the source or drain zone of the field effect transistor 1. The drain or source zone of the field effect transistor 1 is connected via the diode 3 to the terminal 31. The gate terminal of the field effect transistor 1 is connected to the source or drain zone of the field effect transistor 2, and the gate terminal of the field effect transistor 2 is connected to the drain or source zone of the field effect transistor 1.

In the following, the function of the current supply illustrated in FIG. 1 will be briefly described. If a negative voltage is present between the terminals 21 and 31, no current flows between these terminals 21 and 31. In this case the diode 3 blocks. In the case of positive voltages the diode 3 assumes its conductive state, which means that a current commences to flow between the terminals 21 and 31 as the transistors 1 and 2 are of the normally-on type. With an increasing gate voltage across the transistor 1, the p-channel of this transistor is slowly constricted. This results in the transistor 2 also becoming blocked. Therefore the I–V (current-voltage) curve re-approaches 0.

Figure 2:
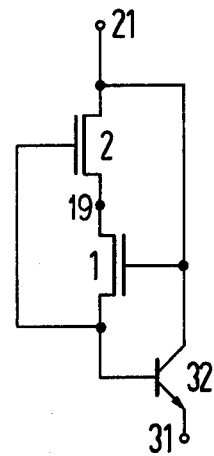

FIG. 2 illustrates another embodiment of a current supply corresponding to the invention. The arrangement again consists of the two transistors 1 and 2 which are wired in the same way as the transistors 1 and 2 in FIG. 1. Details of FIG. 2 which have already been described in association with FIG. 1 bear the corresponding references. In the arrangement in FIG. 2, a bipolar transistor 32 has been provided in place of the diode 3. This transistor is connected by its base terminal to the drain or source terminal of the transistor 1 and to the gate terminal of the transistor 2. The emitter terminal of the transistor 32 is provided with the terminal 31. The collector terminal of the transistor 32 is connected to the gate terminal of the transistor 1 and to the source or drain terminal of the transistor 2. In the case of negative voltages, the transistors 1 and 2 are conductive and the transistor 32 is blocked. In the case of low positive voltages, the transistor 32 is switched conductive so that initially there is an increase in current. Then, with increasing positive voltages, the transistors 1 and 2 assume their blocking state for which reason the current-voltage curve re-approaches 0.

Figure 3:
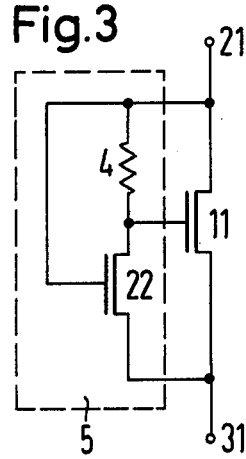

FIG. 3 illustrates a current supply corresponding to the invention comprising two MOS transistors 11 and 22. The transistor 11 exhibits the start voltage $V_{T11}$, and the transistor 22 exhibits the start voltage $V_{T22}$. The transistor 11 is connected on the one hand to the terminal 21 and on the other hand to the terminal 31. The gate terminal of the transistor 11 is connected via a resistor 4 to the terminal 21 and to the gate terminal of the transistor 22. Furthermore the gate terminal of the transistor 11 is connected to the source or drain terminal of the transistor 22. The drain or source terminal of the transistor 22 is connected to the terminal 31. The circuit which consists of the resistor 4 and the transistor 22 represents an inverter 5.

The mode of functioning of this circuit illustrated in FIG. 3 is now to be explained in association with FIG. 5. In the case of negative voltages V between the terminals 21 and 31, the transistors 11 and 22 block. Therefore no current flows between the terminals 21 and 31. In the case of low positive voltages V, initially with a start voltage $V_{T11}$ the transistor 11 is switched conductive via the resistor 4 and its gate terminal. This results in a current commencing to flow between the terminals 21 and 31. With increasing voltages V, the current I also increases until, when the start voltage $V_{T22}$ is reached across the gate terminal of the transistor 22, the transistor 22 is switched conductive. This results in the gate terminal of the transistor 11 becoming short-circuited with the terminal 31, for which reason the transistor 11 assumes its blocking state, and for which reason, in the case of a further increase in the voltage V between the terminals 21 and 31, the current flow between these terminals is again reduced and approaches 0.

In the circuit illustrated in FIG. 3, the transistors 11 and 22 exhibit different start voltages $V_{T11}$ and $V_{T22}$.

Figure 4:
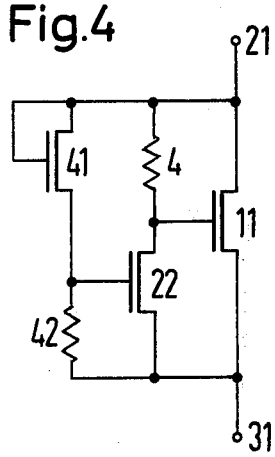
Figure 5:
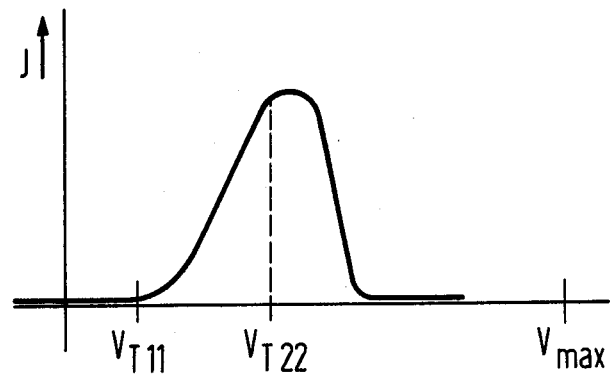
FIG. 5 illustrates the I–V curve of a Lambda element used in the current supply of this invention.

FIG. 4 shows a circuit in which the transistors 11 and 22 possess the same start voltages. In order to achieve a similar characteristic curve as in the circuit shown in FIG. 3, in the case of the circuit illustrated in FIG. 4 the transistor 22 is driven via a voltage divider which consists of the resistors 41 and 42.

Advantageously the dimensions of the integrable circuit elements and the electric properties thereof are selected in accordance with the requisite I-V curves within the bounds of the technilogical possibilities.

Figure 6:
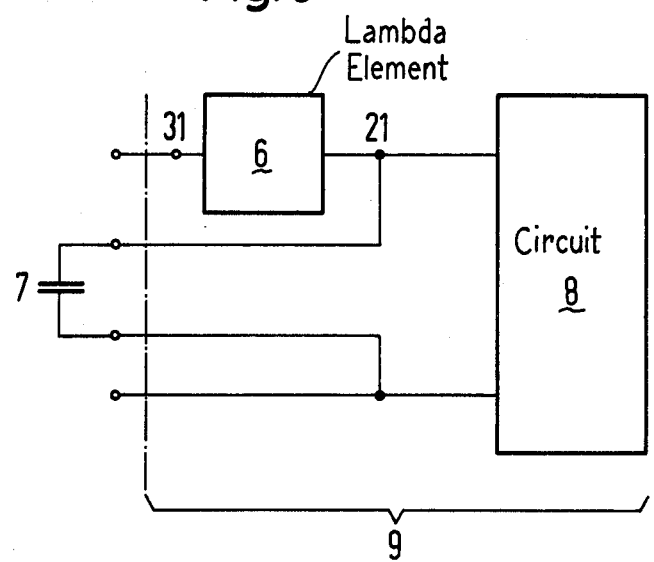
FIG. 6 illustrates a current supply corresponding to the invention.

FIG. 6 illustrates a current supply corresponding to the invention in association with a single-path rectifier which is known per se. In accordance with the invention, one of the above described Lambda elements serves as a diode 6. Apart from the capacitor 7, which is an external component, the overall current supply circuit and the circuit 8 which is to be supplied with current can be integrated on one chip 9.

The above described Lambda element can also be used correspondingly in association with other rectifier circuits, for example two-path rectifiers or Graetz rectifiers. In these cases the existing rectifiers will be replaced by the above described Lambda elements. Apart from the requisite capacitance, these circuits are also fully integrable.

The above described Lambda elements are of particular significance in association with circuits operating as automatically controlled static converters for higher voltages. The series connection of a plurality of elements provides advantages in terms of high blocking and forward voltages. Circuits of this type are suitable in designs in ESFI-SOS technology, in particular for voltages of above 50 V.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A current supply circuit for supplying current to an integrated circuit, comprising: a Lambda element means for rectifying an alternating input current which blocks when negative voltages are connected thereacross, which passes current in a predetermined positive voltage passband, and which blocks current again for positive voltages higher than the passband; a capacitor connected at an output of the Lambda element means; an alternating input current source being connected to an input of said Lambda element means; and said integrated circuit and Lambda element means connected to supply current thereto being integrated on a common chip.

2. A current supply circuit as claimed in claim 1, characterized in that the Lambda element means comprises first and a second field effect transistors and a diode which are connected in series with one another, a first terminal of the first field effect transistor being connected to a first terminal of the Lambda element means, a second terminal of the first field effect transistor being connected to a first terminal of the second field effect transistor, a second terminal of the second field effect transistor being connected to a first terminal of the diode, a second terminal of the diode being connected to a second terminal of the Lambda element means, a gate terminal of the second field effect transistor being connected to the first terminal of the first field effect transistor, and the gate terminal of the first field effect transistor being connected to the second terminal of the second field effect transistor.

3. A current supply circuit as claimed in claim 1, characterized in that the Lambda element means comprises a first field effect transistor, a second field effect transistor, and a bipolar transistor, a first terminal of the first field effect transistor being connected to a first terminal of the Lambda element means, a second terminal of the first field effect transistor being connected to a first terminal of the second field effect transistor, a second terminal of the second field effect transistor being connected to a base terminal of the bipolar transistor, an emitter terminal of the bipolar transistor being connected to a second terminal of the Lambda element means, a gate terminal of the first field effect transistor being connected to the second terminal of the second field effect transistor, and a gate terminal of the second field effect transistor and a collector terminal of the bipolar transistor being connected to the first terminal of the first transistor.

4. A current supply circuit for supplying current to an integrated circuit, comprising: a Lambda element means for rectifying an input current which blocks when negative voltages are connected thereacross, which passes current in a predetermined positive voltage passband, and which blocks current again for positive voltages higher than the passband; a capacitor connected at an output of the Lambda element means; said integrated circuit and Lambda element means connected to supply current thereto being integrated on a common chip;
and said Lambda element means comprising a first field effect transistor, a second field effect transistor, and a load element, a first terminal of the first transistor being connected to a first terminal of the Lambda element means, a second terminal of the first field effect transistor being connected to a second terminal of the Lambda element means, that a first terminal of the second field effect transistor is connected to a gate terminal of the first field effect transistor and to the first terminal of the load element, a gate terminal of the second field effect transistor being connected to a second terminal of the load element and to the first terminal of the first field effect transistor, a second terminal of the second field effect transistor being connected to a second terminal of the first field effect transistor and that the first transistor and the second field effect transistor having different start voltages.

5. A current supply circuit as claimed in claim 4 characterized in that the load elements comprise field effect transistors connected as resistors.

6. A current supply circuit for supplying current to an integrated circuit, comprising: a Lambda element means for rectifying an input current which blocks when negative voltages are connected thereacross, which passes current in a predetermined positive voltage passband, and which blocks current again for positive voltages higher than the passband; a capacitor connected at an output of the Lambda element means; said integrated circuit and Lambda element means connected to supply current thereto being integrated on a common chip;

and said Lambda element means comprising a first field effect transistor, a second field effect transistor, a first load element, a second load element, and a third load element, a first terminal of the first field effect transistor being connected to a first terminal of the Lambda element means, a second terminal of the first field effect transistor being connected to a second terminal of the Lambda element means, a first terminal of the second field effect transistor being connected to a gate terminal of the first transistor and to a first terminal of the first load element, a gate terminal of the second field effect transistor being connected to a first terminal of the third load element, a second terminal of the third load element and a second terminal of the first load element being connected to the first terminal of the first field effect transistor, the gate terminal of the second field effect transistor being connected to a first terminal of the second load element, a second terminal of the second load element and a second terminal of the second field effect transistor being connected to the second terminal of the first field effect transistor, the first field effect transistor and the second field effect transistor having the same start voltages.

7. A current supply circuit as claimed in claim 6, characterized in that the load elements comprise field effect transistors connected as resistors.

8. A current supply circuit as claimed in claim 1, characterized in that the circuit is arranged on the chip in a ESFI (SOS) technique.

9. The current supply circuit of claim 1 wherein except for the capacitor no other parts of the current supply circuit are external to the common chip and the input current source is directly connected to the Lambda element means.

10. The current supply circuit of claim 9 wherein the alternating input current source has voltages present thereon which are substantially higher than voltages necessary for operation of the integrated circuit.

* * * * *